United States Patent [19]

Lin

[11] Patent Number: 5,586,309
[45] Date of Patent: Dec. 17, 1996

[54] UNIVERSAL PROGRAMMING INTERFACE FOR CLOCK GENERATORS OPERABLE IN A PARALLEL PROGRAMMING MODE AND A SERIAL PROGRAMMING MODE

[75] Inventor: Tao Lin, Fremont, Calif.

[73] Assignee: Sierra Semiconductor Corporation, San Jose, Calif.

[21] Appl. No.: 341,036

[22] Filed: Nov. 15, 1994

Related U.S. Application Data

[63] Continuation of Ser. No. 897,031, Jun. 11, 1992.

[51] Int. Cl.[6] .................................. G06F 1/02; H02J 1/00
[52] U.S. Cl. ........................... 395/556; 327/44; 327/145; 327/147
[58] Field of Search .................................... 395/550, 138, 395/425, 278; 358/160; 327/44, 145, 147

[56] References Cited

U.S. PATENT DOCUMENTS

| | | | |
|---|---|---|---|
| 4,283,768 | 8/1981 | Scott | 364/607 |
| 4,562,402 | 12/1985 | Irvin | 327/44 |
| 4,719,593 | 1/1988 | Threewitt et al. | 364/900 |
| 4,901,036 | 2/1990 | Herold et al. | 331/25 |
| 4,939,575 | 7/1990 | Childers | 358/160 |
| 4,984,195 | 1/1991 | Nakamura et al. | 395/550 |
| 4,998,075 | 3/1991 | Patton, III et al. | 331/2 |
| 5,031,131 | 7/1991 | Mikos | 364/921 |
| 5,041,764 | 8/1991 | Midland et al. | 315/368 |
| 5,059,280 | 3/1992 | Wunner et al. | 327/145 |
| 5,155,846 | 10/1992 | Niijima | 395/550 |
| 5,179,642 | 1/1993 | Komatsu | 395/135 |
| 5,235,613 | 8/1993 | Brown et al. | 371/1 |

OTHER PUBLICATIONS

A specification sheet entitled "AV9116", by Chris Parry, Nexus Manufacturers' Representative, Inc., dated Apr., 1991, 4 pages.
Sierra Semiconductor data sheet "SC11410/SC11411 Frequency Synthesizer" pp. 1–15.

Primary Examiner—Christopher B. Shin
Attorney, Agent, or Firm—Burns, Doane, Swecker & Mathis, L.L.P.

[57] ABSTRACT

A programmable frequency synthesizer includes a first memory (e.g., ROM) for storing a plurality of pre-programmed frequencies, a second memory (e.g., RAM) for storing at least one user input programmable frequency, and dual purpose frequency synthesizer inputs for providing command address information to select one of the pre-programmed frequencies from the first memory and for providing serial data representing a user input programmable frequency to be stored in the second memory. The frequency synthesizer further includes a control input and decoder for directing the address information and the user input programmable frequency data to the first or second memory, respectively.

15 Claims, 6 Drawing Sheets

UNIVERSAL PROGRAMMING INTERFACE FOR CLOCK GENERATORS OPERABLE IN A PARALLEL PROGRAMMING MODE AND A SERIAL PROGRAMMING MODE

This application is a continuation of application Ser. No. 07/897,031, filed Jun. 11, 1992.

BACKGROUND OF INVENTION

1. Field of Invention

The present invention relates generally to clock generators for graphics controllers and, more particularly, to programmable interfaces for clock generators.

2. State of the Art

To support different display resolutions, VGA (including SuperVGA and XGA) controllers usually require many different pixel clock frequencies. A programmable clock generator is an ideal and economic device for providing a VGA controller with these varied frequencies. Generally speaking, conventional programmable clock generators include either of two basic types of programming interfaces. These two basic types of programming interfaces are represented in FIG. 1 as a pre-programmed parallel interface and a programmable serial interface.

Clock generator integrated circuits are presently available that include either a parallel interface, a serial interface or both a parallel and a serial interface. The advantage of a parallel interface is its simplicity in selectively accessing one of a plurality of pre-programmed frequencies from a memory. The advantage of a serial interface is that it can be used to load an arbitrary frequency designated by a user into a memory. However, a parallel interface can select only the pre-programmed frequencies stored in memory, while a serial interface requires external programming circuitry, a relatively complex programming procedure, and a dedicated I/O address bus.

Figure 1:
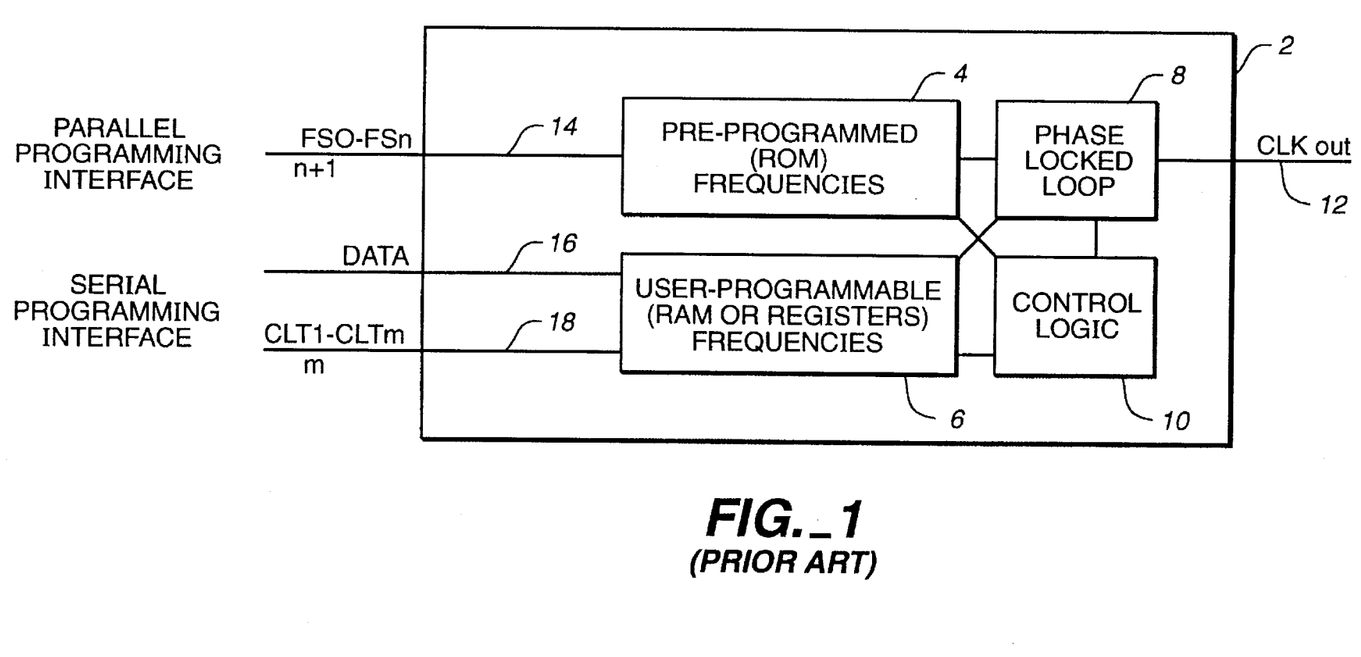
FIG. 1 shows a known parallel and serial programming interface for a clock generator.

FIG. 1 shows a conventional parallel and serial programming interface for a clock generator. The clock generator 2 includes a ROM 4, a RAM 6, (or Registers) a phase locked loop 8 and control logic 10, all of which are interconnected. A frequency output, represented as CLKout 12, provides a programmable frequency output which is compatible with video formats such as VGA, EGA, MCGA, CGA, and MDA. Further, the clock generator supports two frequency programming modes: an internal frequency selection mode and an external frequency program mode. In the internal mode, frequency select lines 14 (labelled $FS_0$ to $FS_n$) are used to select a frequency from $2^n$ pre-programmed frequencies that are stored in the ROM 4.

In the external mode of operation, a user-selected frequency program code is provided through a serial interface. In this mode of operation, any frequency within the available VCO frequency range of the clock generator can be produced at the output CLKout. During serial programming, data related to the desired frequency is provided to the clock generator via signal line 16. The clock generator further includes control lines 18 that provide m serial interface control signals designated $CLT_1$ to $CLT_m$ in the drawing. The control signals for the serial interface can include, for example, a read/write signal preceded by a pointer reset for at least one clock cycle to request reading or writing into a serial shift-register. Writing occurs by applying a pointer reset followed by a number (e.g., eighteen) of consecutive write cycles to load the shift-register.

Typically, a parallel interface is used for compatibility with standard interface formats, such as the IBM VGA Standard. However, conformance with such a standard restricts the flexibility of these frequency synthesizers because only limited pre-programmed frequencies are available on the integrated circuits.

SUMMARY OF THE INVENTION

The present invention relates generally to a programmable clock generator which includes a first memory for storing a plurality of pre-programmed frequencies; a second memory for storing at least one user input programmable frequency; clock generator inputs for providing command address information to select one of the pre-programmed frequencies from the first memory and for providing data representing the at least one user input programmable frequency to be stored in the second memory, the clock generator inputs further including a control and decode input for directing the address information and the user programmable frequency data to the first or second memory, respectively.

BRIEF DESCRIPTION OF THE DRAWINGS

Other aspects of the present invention will become more apparent from the following detailed description of the preferred embodiments as described in conjunction with the accompanying drawings, in which.

DETAILED DESCRIPTION OF THE PREFERRED EMBODIMENTS

Figure 2:
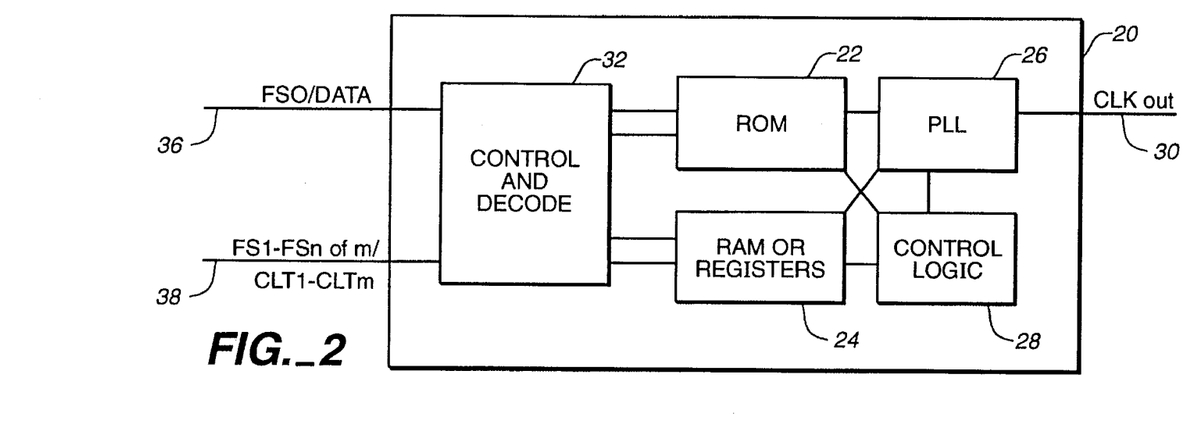
FIG. 2 shows an embodiment of a universal programming interface for a clock generator in accordance with the present invention.

In FIG. 2, a clock generator 20 includes a ROM 22 for storing a plurality of pre-programmed frequencies. Further, the clock generator 20 includes a RAM (or register) 24 for storing at least one user input programmable frequency. As described with respect to FIG. 1, the clock generator 20 also includes a phase locked loop 26 and control logic 28 as well as a frequency output 30 designated CLKout. The clock generator 20 further includes an input control and decode circuitry 32.

The clock generator inputs provide command address information to select one of the pre-programmed frequencies from the first memory 22 and provide data representing the at least one user programmable frequency to be stored in the second memory 24. The clock generator inputs further include a control and decode input for directing the address information and the user programmable frequency data to the first or second memory, respectively.

More particularly, the clock generator inputs include signal lines 36 and 38. A set of signals $FS_0$/data, $FS_1/CLT_1$, ..., $FS_n/CLT_m$ (n>m) are applied on signal line 36 and n signal lines 38 as either parallel programming signals or serial programming signals, respectively. A particular state (or a sequence of states) of these lines will be decoded by the input control and decode circuitry to select one of these two programming modes. The signal lines 36 and 38 are used for both a parallel programming mode and a serial programming mode.

In the embodiment shown in FIG. 2, the clock generator 20 is power-on-reset to the parallel programming mode. The clock generator transitions to the serial programming mode only when new frequencies designated by the user are to be loaded into the RAM 24. Accordingly, compatibility with such standard interfaces as the IBM VGA Standard is guaranteed.

In operation, a latch enable signal provided as one of the control signals opens one of the two latches included in the input control and decode circuitry 32 and closes the other of these two latches. As referenced herein, an "open" condition of a latch corresponds to a state where signals received at the latch input are passed to the latch output (i.e., the latch is transparent); a "closed" condition refers to a state where latch input signals are blocked from the latch output.

When the first of the two latches is open (i.e., the second latch is closed), input signals on the lines 36 and 38 are used to select one of the pre-programmed frequencies stored in the ROM 22. On the contrary, when the second latch is open and the first latch is closed, signal lines 36 and 38 are used to load any desired frequency within the VCO frequency range into a register of RAM 24. Any frequency loaded via the serial interface can be accessed during clock generator operation to replace at least one of the pre-programmed frequencies stored in ROM 22 and can be selected from RAM 24 by the parallel programming signals when the chip is switched to a parallel programming mode.

Figure 3:
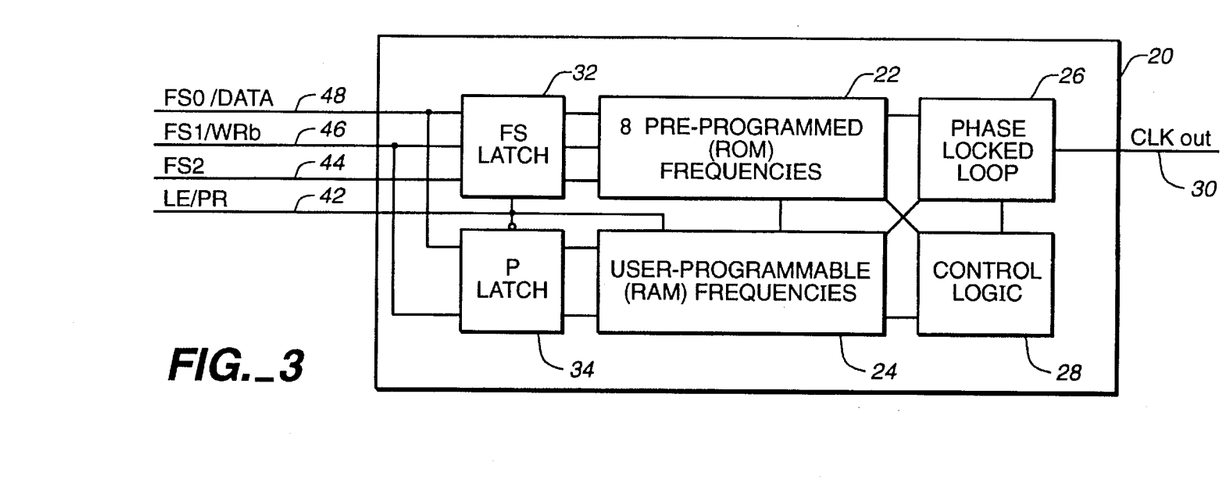
FIG. 3 shows an alternate embodiment of a universal programming interface for a clock generator in accordance with the present invention.

In FIG. 3, a clock generator includes features similar to those of the above-described FIG. 2 generator. The input control and decode circuitry is shown to consist of simply a Frequency Select (FS) latch and a Programming (P) latch. Four input pins to the clock generator include a latch enable/pointer reset control pin 42 and control pins 44, 46 and 48 for providing command address information to select one of the pre-programmed frequencies stored in the first memory 22 or to input data (i.e., via pins 46 and 48) representing at least one user programmable frequency to be stored in the second memory 24.

The latch enable/pointer reset pin 42 is a dual purpose pin. A first purpose of this pin is to function as a latch enable control input. When a latch enable signal LE is a first logic state (e.g., logic low), the FS latch 32 is transparent (i.e., open) and the P latch is closed. In this case, the control pins 44, 46 and 48 represent frequency select values $FS_0$ to $FS_2$ for selecting one of the pre-programmed frequencies (e.g., one of eight frequencies) stored in the ROM 22.

On the contrary, when the latch enable signal is a logic high, the parallel FS-latch 32 is closed and the programmable serial P-latch is transparent. In this case, a user may load any desired frequency into the RAM 24 provided the frequency is within the range of the clock generator's VCO. Because only one of the FS-latch 32 and the P-latch 34 is active to receive information on the signal lines 44, 46, 48 at any given time, the signal lines 44, 46, 48 are used for both a parallel programming mode and a serial programming mode.

A second purpose of the latch enable/pointer reset pin 42 is to act as a pointer reset for a serial programming register of RAM 24. The pointer is reset on a low-to-high transition of the signal on pin 42 so that the pointer is reset to zero.

The control pins 44, 46 and 48 will now be described in greater detail. The control input $FS_0$/data is also a dual purpose pin. When the latch enable/pointer reset is a logic low, the signal at the control input pin 48 represents the first selection pin for the pre-programmed frequency to be selected from ROM 22. When the latch/enable pointer reset is a logic high, the signal on the control pin 48 provides data to a serial programming register of the serial interface (i.e., RAM 24).

The control pin 46 is also a dual purpose pin. When the latch enable/pointer reset is a logic low, the signal on the control pin 46 is the second selection pin for the pre-programmed frequency to be selected from the ROM 22. When the latch enable/pointer reset is a logic high, the control input on the line 46 provides a write enable pulse $WR_b$ to shift data into the aforementioned serial programming register. The data is, for example, shifted into the register on a rising edge of the signal present on control pin 46.

The control pin 44 is used during a selection of one of the pre-programmed frequencies from the ROM 22. More particularly, the control signal on this input represents the third selection pin for addressing one of the eight pre-programmed frequencies stored in the ROM 22.

Figure 4:
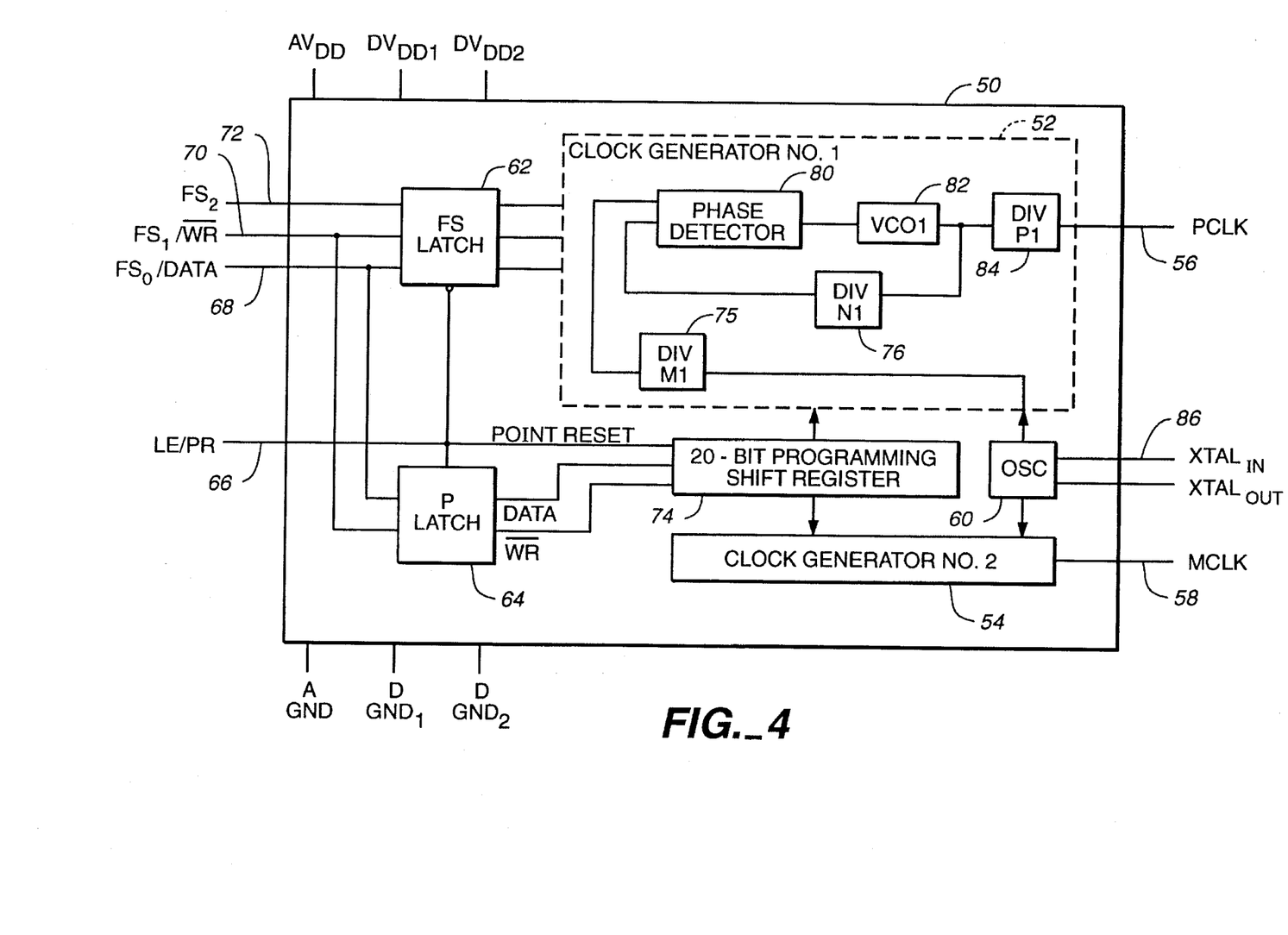
FIG. 4 shows a more detailed block diagram of a universal programming interface for a clock generator in accordance with the present invention.

In FIG. 4, a dual programmable clock generator is designated generally as element 50 and includes two digitally controlled clock generators 52 and 54 for generating two independent clock frequencies. In an exemplary embodiment, the two clock generator outputs are used to drive the pixel (video dot) clock and memory clock inputs of a typical VGA controller chip. The pixel clock is designated PCLK and represents the output 56. The memory clock is designated MCLK and represents output 58.

A single crystal or externally generated system bus clock (e.g., 1.4318 MHz) 60 may be used as an input reference frequency for the clock generators 52 and 54. A Frequency Select (FS) latch is represented as parallel programming latch 62. Although the two clock generators 52 and 54 shown in FIG. 4 are generally similar, clock generator 52 can output one of eight pre-programmed frequencies while clock generator 54 outputs a single pre-programmed frequency.

A single Programming (P) latch 64 is used for serially programming both the clock generators 52 and 54. The FS and P latches receive clock generator inputs 66, 68, 70 and 72. These inputs are similar to those described with respect to inputs 42 to 48 of FIG. 3.

A 20-bit programming shift-register 74 is included in the serial interface for providing a user-programmable frequency in response to the inputs 66 to 70. The 20-bit shift-register 74 thus represents a single register RAM suitable for storing a desired frequency programmed by the user via the serial interface for output as either PCLK or MCLK.

The ROM and phase locked loop described above with respect to FIGS. 2 and 3 are shown more particularly in FIG. 4. The clock generator 52 includes two programmable 7-bit dividers 75 and 76 (having division factors $M_1$ and $N_1$, respectively) and a phase-locked loop circuit 78. The phase-locked loop circuit 78 includes a phase detector 80, the output of which drives a voltage controlled oscillator (VCO) 82. The output of the VCO 82 is optionally divided in a post scaler divider 84 and output from the clock generator as the PCLK output 56. The post scaler divider 84 (e.g., having a division factor $P_1=2$ or 4) is used if a lower output frequency is desired.

Similar components as described with respect to clock generator 52 are used for the MCLK output from the clock generator 54. For example, a post scaler divider (e.g., division factor $P_1=2$ or 4) is used in the clock generator 54 if the output frequency used to generate a lower MCLK is desired.

In operation, the PCLK output frequency and the MCLK output frequency are determined as follows:

$$PCLK=(N_i/(M_i*P_i))*F_{osc}$$

$$MCLK=(N_i/(M_i*P_i))*F_{ocs}$$

where $N_i$, $M_i$ and $P_i$ are the divider factor values for clock generator i, with i=1 for PCLK and i=2 for MCLK; $F_{osc}$ corresponds to the input reference frequency at an oscillator reference frequency input 86 (labelled $XTAL_m$); $P_i=1, 2, 4, 8$; $M_i=1$ to 127; $N_i=1$ to 127, and division ratios of zero and 1 are divided by 1.

In operation, at power-on-reset the two clock generators 52 and 54 default to preselected, pre-programmed clock frequencies of the internal frequency selection mode. To ensure that clock generator 52 is initialized to the desired default frequency, the latch enable/pointer reset control pin 66 is held at a logic zero during power-on-reset so that the FS latch 62 remains transparent (i.e., open).

A default frequency for clock generator 52 is one of eight pre-programmed frequencies determined by the configuration of the frequency select pins $FS_0$ to $FS_2$ on control inputs 68 to 72. Clock generator 54 defaults to a single pre-programmed frequency. In an exemplary embodiment, default frequencies for the clock generators 52 and 54, assuming a 14.31828 MHz reference frequency input are as follows:

| $FS_2$ | $FS_1$ | $FS_0$ | Clock Generator No. 1 - PCLK (MHz) | Clock Generator No. 2 - MCLK (MHz) |
|---|---|---|---|---|
| 0 | 0 | 0 | 25.175 | 32.000 |
| 0 | 0 | 0 | 28.321 | 32.000 |
| 0 | 1 | 0 | 40.000 | 32.000 |
| 0 | 1 | 0 | 65.000 | 32.000 |
| 1 | 0 | 0 | 50.000 | 32.000 |
| 1 | 0 | 1 | 44.900 | 32.000 |
| 1 | 1 | 0 | 56.000 | 32.000 |
| 1 | 1 | 1 | 80.000 | 32.000 |

After power-on-reset, clock generator 52 can be set to any one of the pre-programmed frequencies. In addition to the pre-programmed frequencies, each clock generator can be programmed by the VGA controller using the serial programming interface to generate any desired frequency within the frequency range of the clock generator's VCO. Serial programming by a VGA controller can be accomplished using the VGA controller's three clock select output signals as will be described briefly with respect to FIGS. 5a–5c.

Clock generator 52 is, for example, optimized to generate PCLK frequencies in the range of 45 to 100 MHz. Accordingly, the post scaler divider 84 must be used if the required frequency output is less than 45 MHz. The clock generator 54 is optimized for generating MCLK output frequencies in the range of 30 to 70 MHz. Again, a post scaler divider (e.g., $P_2=2$ or 4) must be used if any output frequency less than 30 MHz is required.

In the internal frequency selection mode of operation for the FIG. 4 clock generator, the output frequency is determined using pre-programmed $M_i$, $N_i$ and $P_i$ values generated by a ROM. The clock generator 52 generates one of eight pre-programmed frequencies based on the state of frequency select inputs $FS_0$ to $FS_2$. The clock generator 54 generates a single pre-programmed frequency.

In an external frequency program mode, the two clock generators 52 and 54 can be programmed independently through the serial programming interface to generate any frequency within their respective VCO's range. As will be described below, the external frequency mode is enabled by setting a mode control bit $DS_3$ of the VCO 82 (or the comparable VCO of the clock generator 54) to a logic value representative of an external programming mode.

In the external frequency program mode, the clock generator 52 selects a user programmable frequency input via the serial interface when $FS_0=FS_2=0$ and $FS_1=1$. Other combinations of the frequency select inputs will select from the seven remaining pre-programmed frequencies shown in the aforementioned table. Thus, the pre-programmed frequency for $FS_0=FS_2=0$, $FS_1=1$ on the clock generator 52 is not available in the external frequency program mode. Further, in the external frequency programmable mode, the user programmable frequency set via the serial interface for the clock generator 54 is always selected.

During the external frequency program mode, a write to the serial programming shift-register 74 is preceded by a pointer reset on input pin 66 as mentioned previously. The pointer is reset to zero on a rising edge of the signal at latch enable/pointer reset control pin 66. Afterwards, one bit of data is shifted into the register on every rising edge of a write enable pulse on control input 70. After the 20 bits are shifted into the serial programming shift-register 74, the data is automatically loaded into the clock generator selected by a clock generator address bit.

The twenty bits of the serial programming shift-register 74 are defined as follows:

| | |
|---|---|
| $DS_0$ | Clock Generator Address Bit |
| | $DS_0 = 1$ - Clock generator 52 is selected for programming |
| | $DS_0 = 0$ - Clock generator 54 is selected for programming |
| $DS_1$ | PCLK or MCLK Tri-State bit |
| | $DS_1 = 1$ - Tristate PCLK or MCLK output driver for the selected clock generator. |
| | $DS_1 = 0$ - Enables the PCLY, or MCLK output driver for the selected clock generator. |
| | At power-on-reset, both the clock output drivers are enabled. |
| $DS_2$ | VCO Disable bit |
| | $DS_2 = 1$ - Disables the VCO for the selected clock generator. |
| | $DS_2 = 0$ - Enables the VCO for the selected clock generator. |
| | At power-on-reset, both VCOs of clock generators 52 and 54 are enabled. |
| | When VCO is disabled and $DS_1 = 0$, the clock output is logic high. |
| $DS_3$ | VCO Mode bit |
| | $DS_3 = 1$ - Enables internal frequency selection mode for the selected clock generator. |
| | $DS_3 = 0$ - Enables external frequency program mode for the selected clock generator. |
| | For VCO of clock generator 52, external mode is selected only if $DS_3 = 0$ and $FS_0 = 0$, $FS_1 = 1$ and $FS_2 = 0$. |
| | For VCO of clock generator 54, the values of $FS_0$, $FS_1$ and $FS_2$ do not affect the mode selection. |
| | At power-on-reset, the internal frequency selection mode is selected for both clock generators. |
| $DS_4$–$DS_5$ | Post scaler divider for VCO of clock generator 52 or 54 (e.g., selects divisor of 1, 2, 4 or 8, respectively). |
| $DS_6$ to | $N_1$ or $N_2$ clock divider for clock |

| | |
|---|---|
| $DS_{12}$ | generator 52 or 54, respectively. |
| $DS_{13}$ to | $M_1$ or $M_2$ clock divider for clock generator |
| $DS_{19}$ | 52 or 54, respectively. |

During input of the above information to shift register 74, the bit $DS_0$ is shifted in first, and the bit $DS_{19}$ is shifted in last.

To interface the dual programmable clock generator of FIG. 4 to a VGA controller, the $FS_0$/data, $FS_1/\overline{WR}$, $FS_2$ and LE/PR pins are connected with three clock select (CS) pins of the VGA controller (e.g., CS[2:0]). However, those skilled in the art will recognize that any user programmable outputs available from the VGA controller can be used as control signal inputs to the clock generator.

Figure 5A:
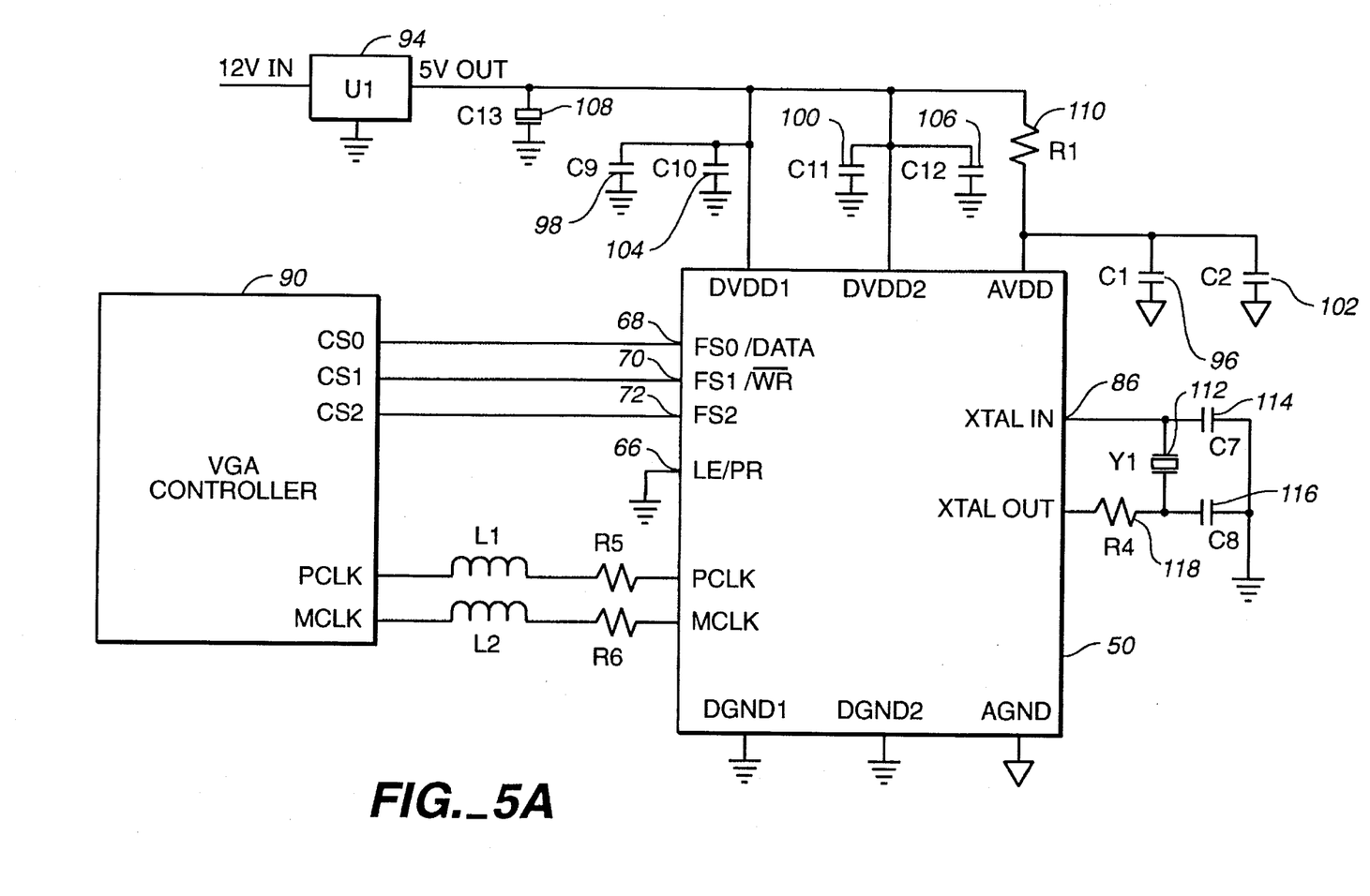
FIGS. 5a–c show exemplary configurations for interfacing a clock generator designed in accordance with the present invention with exemplary VGA controllers.
Figure 5B:
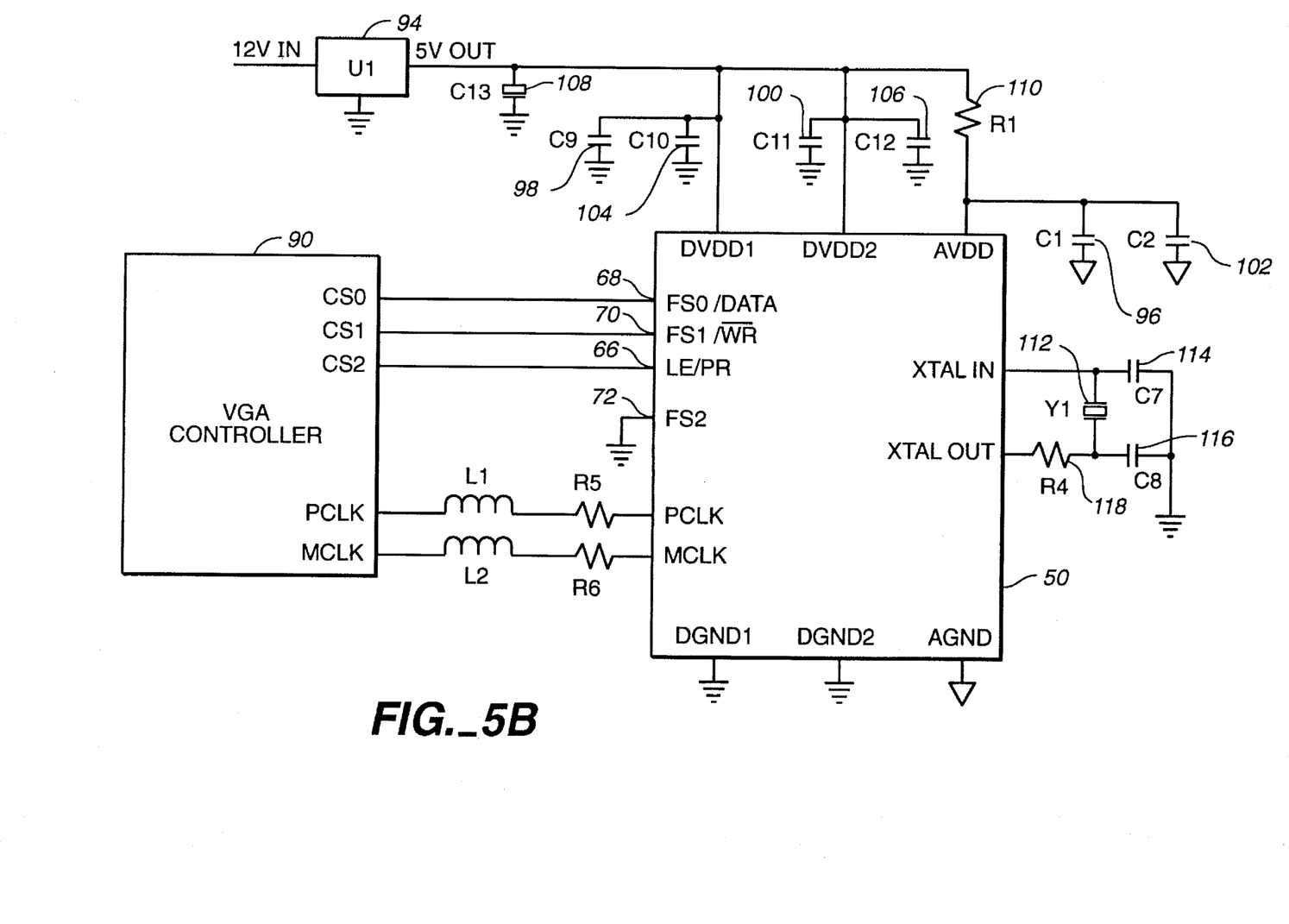
Figure 5C:
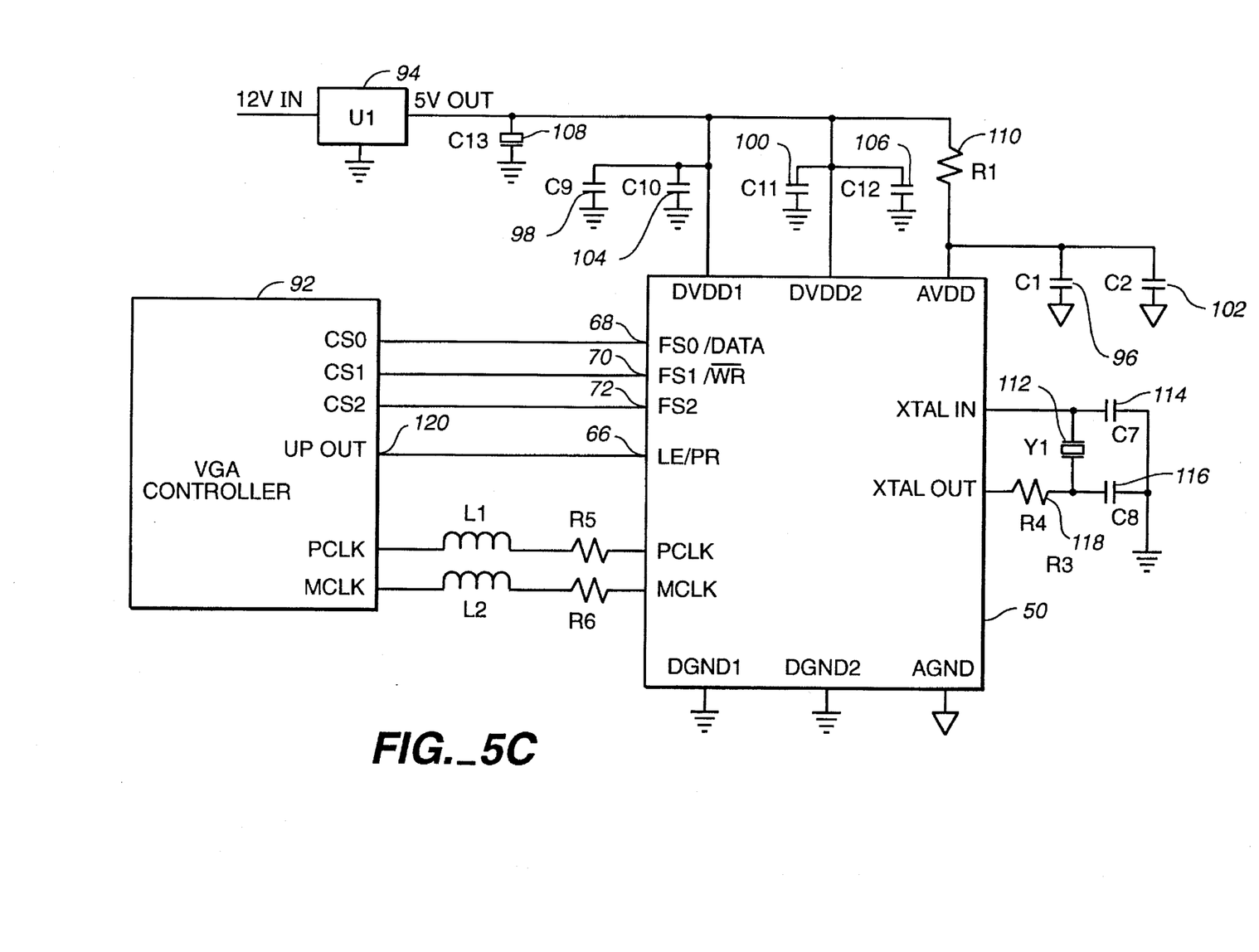

Three exemplary configurations for interfacing the FIG. 4 clock generator with a VGA controller 90 are shown in FIGS. 5a–c. In FIG. 5a, the latch enable/pointer reset pin 66 is tied to logic zero (e.g., ground), and the control inputs 68 to 72 are interfaced (i.e., tied) to the VGA controller's three clock select pins $CS_0$, $CS_1$ and $CS_2$. Nine pre-programmed frequencies are available, eight of these being used for the PCLK and one for the MCLK. In each of FIGS. 5a–c, a voltage regulator 94 provides a voltage supply to the clock generator via a network which includes, in the exemplary embodiment illustrated, capacitors 96, 98, 100 (e.g., 0.1 microfarad); capacitors 102, 104, 106 (e.g., 0.01 microfared); a capacitor 108 (e.g., 0.10 microfared); and, a resistor 110 (e.g., 22 ohms). The oscillator reference frequency input 86 is provided via a 14.318 MHz series crystal 112, capacitors 114, 116 (e.g., 32 picofarads) and a resistor 118 (e.g., 500 ohm).

In FIG. 5b, five pre-programmed frequencies and two user-programmable frequencies are provided. As shown, the control input 72 of FIG. 4 is tied to a logic zero (e.g., ground) and the control inputs 66, 68 and 70 are tied to the VGA controller clock select pins $CS_0$, $CS_1$ and $CS_2$. Four preprogrammed PCLK frequencies and one pre-programmed MCLK frequency are provided. Two user-programmable frequencies (one for PCLK and one for MCLK) are available.

FIG. 5c shows a configuration which is applicable where an additional programmable output pin 120 (e.g., UPOUT) is available from a VGA controller 92. In this configuration, the latch enable/pointer reset pin 66 is tied to the UPOUT pin, and the control inputs 68 to 72 are tied to the VGA controller clock select pins $CS_0$, $CS_1$ and $CS_2$, respectively. Nine pre-programmed frequencies (eight for PCLK and one for MCLK) and two user-programmable frequencies (one for PCLK and one for MCLK) are available.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A programmable frequency synthesizer comprising:

a first memory for storing a plurality of pre-programmed frequencies;

a second memory for storing at least one user input programmable frequency;

dual-purpose frequency synthesizer inputs connected to the first memory and the second memory for providing command address information to select one of the pre-programmed frequencies from the first memory and for providing data representing at least one user input programmable frequency to be stored in the second memory, said dual-purpose frequency synthesizer inputs including at least one input to provide both command address information to said first memory and to provide data for storage in said second memory;

an input control and decoder for receiving the frequency synthesizer inputs and for directing the frequency synthesizer inputs to the first or second memory in response to a control input;

a first clock generator for producing a first clock frequency as a pixel clock of a graphics controller, wherein said first clock frequency corresponds to one of said plurality of pre-programmed frequencies and said at least one user input programmable frequency; and a second clock generator for producing a second clock frequency as a memory clock of said graphics controller, wherein said second clock frequency also corresponds to one of said plurality of pre-programmed frequencies and said at least one user input programmable frequency.

2. A programmable frequency synthesizer according to claim 1, wherein the input control and decoder further includes:

a first latch for latching said command address information in parallel; and a second latch for latching said user input programmable frequency data serially.

3. A programmable frequency synthesizer according to claim 2, wherein the control input is a latch enable signal line which further includes:

signal lines connected to the first latch and the second latch for providing a signal to select one or the other of the first and second latches.

4. A programmable frequency synthesizer according to claim 3, wherein the frequency synthesizer inputs further include:

a set of dual purpose signal lines including at least one signal line for providing both frequency select information as said command address information and frequency programming information as said user input programmable frequency data.

5. A programmable frequency synthesizer according to claim 1, further including:

a frequency output for driving a clock with a clock frequency which is output from said first memory or said second memory in response to said at least one input.

6. A dual programmable frequency synthesizer comprising:

a first clock generator for producing a first clock frequency as a pixel clock of a graphics controller;

a second clock generator for producing a second clock frequency as a memory clock of said graphics controller;

a serial interface connected to said first and second clock generators for storing at least one user programmed frequency to be output as the first clock frequency or the second clock frequency;

a parallel interface connected to at least one of said first and second clock generators for selecting one of a plurality of pre-programmed frequencies stored in the first clock generator and second clock generator;

at least one input connected to both said serial interface and said parallel interface for providing data to be stored in said serial interface and for addressing said parallel interface to select one of said plurality of pre-programmed frequencies; and a dual purpose control input connected to said serial interface and said parallel interface for activating one or the other of the serial interface and the parallel interface.

7. A dual programmable frequency synthesizer according to claim 6, wherein the serial interface further includes:

a serial latch for selectively activating the serial interface in response to the control input; and a shift register for storing the at least one user programmed frequency.

8. A dual programmable frequency synthesizer according to claim 7, wherein the parallel interface further includes:

a parallel latch for selectively activating the parallel interface in response to the control input.

9. A dual programmable frequency synthesizer according to claim 8, further including:

clock select lines connected to a VGA controller, at least one of said clock select lines being used to both serially store said at least one user programmed frequency in said shift register and to select said one of a plurality of pre-programmed frequencies.

10. Method for generating a desired clock frequency for driving a graphics controller comprising the steps of:

storing at least one pre-programmed frequency in a first memory as a clock frequency;

providing a second memory for storing at least one user programmed frequency as another clock frequency, the at least one user programmed frequency being serially input to the second memory via at least one dual-purpose frequency input line;

selecting the at least one pre-programmed frequency from the first memory via the at least one dual-purpose frequency input line, said at least one dual-purpose frequency input line including at least one input which provides both command address information to said first memory and data for storage in said second memory;

producing a first clock frequency as a pixel clock of a graphics controller, wherein said first clock frequency corresponds to one of said at least one pre-programmed frequency and said at least one user programmed frequency; and producing a second clock frequency as a memory clock of said graphics controller, wherein said second clock frequency also corresponds to one of said at least one pre-programmed frequency and said at least one user programmed frequency.

11. Method according to claim 10, wherein the step of selecting further includes a step of:

addressing the first memory in response to a control input which activates a latch for providing frequency select information to address the first memory.

12. Method according to claim 11, wherein the step of providing further includes the step of:

storing frequency data in the second memory when the control input activates a second latch.

13. Method according to claim 12, further comprising the step of:

interfacing the at least one dual-purpose frequency input line to clock select lines of a VGA controller and responding to outputs of said VGA controller to perform both said step of selecting from said first memory, and said step of serially inputting to said second memory.

14. A method according to claim 10, further including the steps of:

selecting either the at least one pre-programmed frequency from the first memory or the at least one user programmed frequency from the second memory; and outputting the selected at least one pre-programmed frequency or the at least one user programmed frequency in response to said step of selecting.

15. Method according to claim 10, further including the steps of:

selecting at least one of said pre-programmed frequency in said first memory and said at least one user programmed frequency from said second memory; and outputting the selected frequency to a first clock generator for producing said first clock frequency.

* * * * *